United States Patent
Baba et al.

(10) Patent No.: US 11,231,628 B2
(45) Date of Patent: Jan. 25, 2022

(54) DISPLAY

(71) Applicant: Mitsubishi Electric Corporation, Tokyo (JP)

(72) Inventors: Tatsuya Baba, Tokyo (JP); Isao Nojiri, Tokyo (JP)

(73) Assignee: TRIVALE TECHNOLOGIES, Santa Clara, CA (US)

( * ) Notice: Subject to any disclaimer, the term of this patent is extended or adjusted under 35 U.S.C. 154(b) by 0 days.

(21) Appl. No.: 16/396,951

(22) Filed: Apr. 29, 2019

(65) Prior Publication Data

US 2019/0346726 A1 Nov. 14, 2019

(30) Foreign Application Priority Data

May 9, 2018 (JP) .............................. JP2018-090455

(51) Int. Cl.
*G02F 1/1362* (2006.01)
*G02F 1/1368* (2006.01)
*H01L 29/786* (2006.01)

(52) U.S. Cl.
CPC ...... *G02F 1/136204* (2013.01); *G02F 1/1368* (2013.01); *G02F 1/136286* (2013.01); *H01L 29/7869* (2013.01); *G02F 2202/22* (2013.01)

(58) Field of Classification Search
CPC ........... G02F 1/136204; G02F 2202/22; H01L 27/1255
See application file for complete search history.

(56) References Cited

U.S. PATENT DOCUMENTS

| 6,175,394 | B1 * | 1/2001 | Wu | ................... G02F 1/136204 257/360 |
| 2001/0050835 | A1 | 12/2001 | Uchida | |
| 2004/0027502 | A1 | 2/2004 | Tanaka et al. | |
| 2014/0034954 | A1 * | 2/2014 | Yamazaki | ......... G02F 1/136213 257/59 |
| 2018/0026103 | A1 | 1/2018 | Hirano et al. | |

FOREIGN PATENT DOCUMENTS

| CN | 1213177 A | 4/1999 |
| CN | 103944154 A | 7/2014 |
| CN | 105487317 A | 4/2016 |
| JP | S61-079259 A | 4/1986 |
| JP | H08-262485 A | 10/1996 |
| JP | 2009-187029 A | 8/2009 |
| JP | 4385691 B2 | 12/2009 |
| WO | 2016/175034 A1 | 11/2016 |

* cited by examiner

*Primary Examiner* — Jessica M Merlin
(74) *Attorney, Agent, or Firm* — Studebaker & Brackett PC

(57) ABSTRACT

A display includes an antistatic circuit between a common wire and at least one of a signal wire and a scanning wire. The common wire is disposed in a non-display region, and receives a common potential. The signal and scanning wires are disposed in a display region. The antistatic circuit at least includes a first transistor having a floating control electrode, a first main electrode connected to the signal wire or the scanning wire, and a second main electrode connected to the common wire. The first transistor is provided in such a manner that a first capacitance between the control electrode and the signal wire or the scanning wire is larger than a second capacitance between the control electrode and the common wire.

7 Claims, 5 Drawing Sheets

DISPLAY

BACKGROUND OF THE INVENTION

Field of the Invention

The present invention relates to displays, and more particularly, to a display that prevents the entrance of static electricity.

Description of the Background Art

The monitors of current personal computers and of current personal digital assistants, or home appliances, such as TVs, use thin displays to which the principles of liquid crystals, electroluminescence, and other things are applied.

Liquid crystal displays for instance, which are representatives of these displays, are not only thin and lightweight, but also operable at low voltage. Such a liquid crystal display includes a liquid crystal display panel in which liquid crystals are sandwiched between two transparent substrates, which are the main components. One of the transparent substrates is called an array substrate that has pixels arranged in matrix form to constitute a display region, and the other is called a counter substrate (i.e., color filter substrate) that has color filters corresponding to individual pixels, and has a black matrix (i.e., light-shield film).

Reference is made to a liquid crystal display having thin-film transistors (TFTs). Each pixel on the array substrate is provided with the TFT, which is a switching element, thus holding voltage for independently driving the liquid crystals. Such a liquid crystal display provides pictures of high quality with less crosstalk. Moreover, each pixel has scanning wires (i.e., gate wires) that control ON and OFF of the TFT, and signal wires (i.e., source wires) that receive an image signal. A typical pixel is surrounded by the gate wires and the source wires.

Around the display region (i.e., frame region) on the substrate having the TFTs are components, such as leading wires for connecting the gate wires and the source wires to a driver circuit, and an antistatic circuit that prevents the entrance of static electricity from the leading wires.

Thin displays have been widely used; on the other hand, the thin displays have been required to have various product functions and various product forms. Accordingly, the frame region, which is a non-display region, has increasingly been required to be downsized for design improvement, particularly in portable-device displays and vehicle-mounted displays.

Moreover, a technique for high pixel-definition has been developed to display images smoothly. Hence, the antistatic circuit around the display region on the array substrate, and other components need to be downsized in plan view, in the input direction of an external-signal input wire and in the direction of the normal to the external-signal input wire.

Providing an antistatic circuit is one way to prevent static electricity entering a substrate. For instance, Japanese Patent Application Laid-Open No. 8-262485 discloses two diode-connected MOS transistors that are connected in reverse parallel to each other between a drive signal wire and a common wire to constitute a resistor. Unfortunately, this configuration, which requires the two MOS transistors, has a large circuit area, thus failing to downsize the frame region, and to achieve high pixel-definition.

To solve these problems, Japanese Patent No. 4385691 discloses an antistatic circuit having a floating gate electrode. Unfortunately, the antistatic circuit of Japanese Patent No. 4385691 can fail to operate the transistors under low-voltage static electricity, thus causing the static electricity to enter the substrate.

As described above, the antistatic circuit of Japanese Patent Application Laid-Open No. 8-262485 fails to satisfy the demands for frame-region downsizing and the achievement of high pixel-definition. In addition, the antistatic circuit of Japanese Patent No. 4385691 fails to prevent a low-voltage static electricity from entering a substrate.

SUMMARY

It is an object to provide a display including a small antistatic circuit that sufficiently prevents static electricity when the voltage of the static electricity entered the antistatic circuit is low.

An aspect of the present invention provides a display provided with a display region and a non-display region in contact with the display region. The display region is provided with scanning wires and signal wires arranged to intersect each other, and with pixels arranged in matrix form. The pixels each are disposed in a region defined by the scanning wires adjacent to each other and the signal wires adjacent to each other. The display includes an antistatic circuit disposed between a common wire, and at least one of each signal wire and each scanning wire in the display region. The common wire is disposed in the non-display region and receives a common potential. The antistatic circuit at least includes a first transistor having a floating control electrode, a first main electrode connected to the signal wire or the scanning wire, and a second main electrode connected to the common wire. The first transistor is provided in such a manner that a first capacitance formed between the control electrode and the signal wire or the scanning wire is larger than a second capacitance formed between the control electrode and the common wire.

The display, which has the first capacitance larger than the second capacitance, enables the voltage at the floating control electrode in the entrance of static electricity to approximate to that across the signal wire or the scanning wire, and enables the first transistor to operate under low-voltage static electricity, thus passing the static electricity through the common wire. Consequently, the static electricity is sufficiently prevented. In addition, the display, which has the floating control electrode, eliminates the need for a wire electrically connected to the control electrode. Consequently, the antistatic circuit is downsized.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
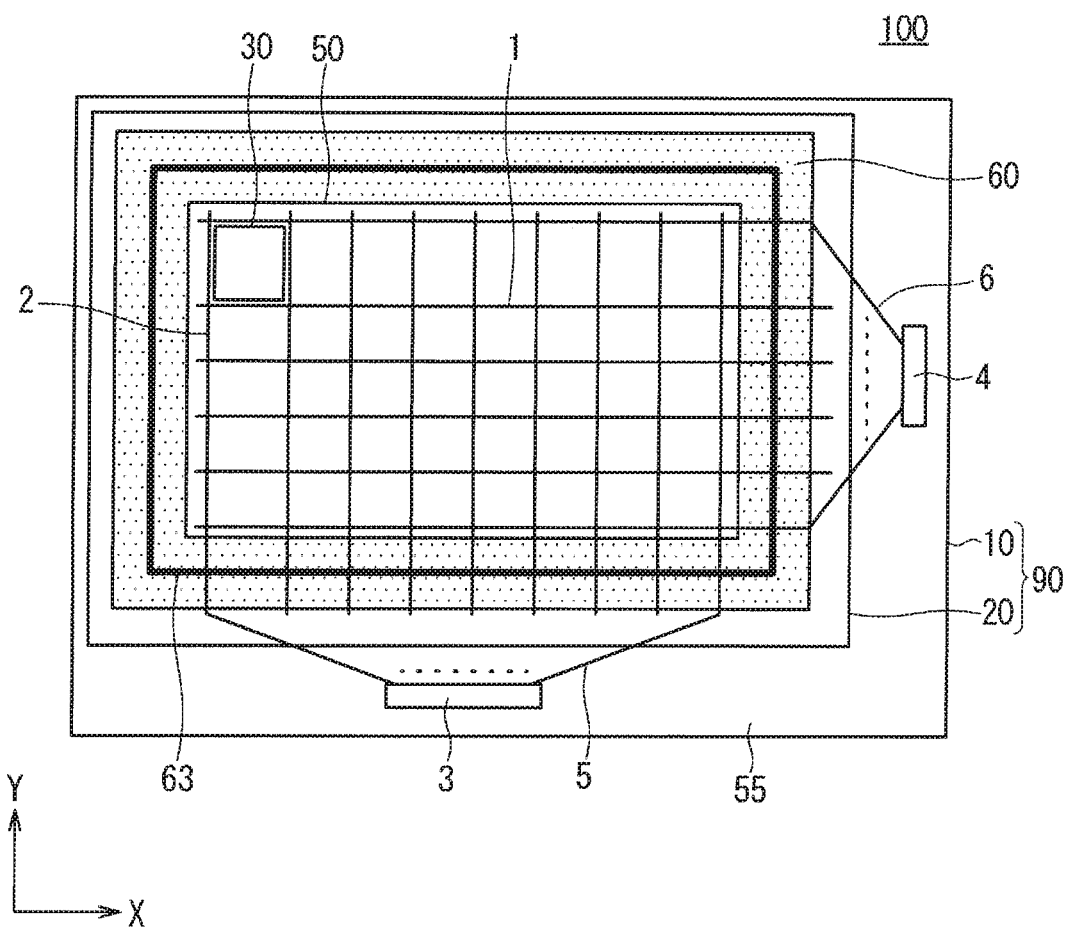
FIG. 1 is a plan view schematically illustrating the overall configuration of a liquid crystal display according to a first preferred embodiment of the present invention.

Preferred embodiments of the present invention will be described with reference to the accompanying drawings. The drawing are schematic; thus the correlation between the size and position of images illustrated in different drawings is not necessarily exact, and is subject to change as appropriate. Like components are denoted by the same signs, and have like names and functions. These like components are not elaborated upon in some cases.

Words, such as "upper", "lower", "side", "bottom", "front", and "back", all of which indicate particular positions and directions, are used for easy understanding of the details of the preferred embodiments, and thus have nothing to do with practical directions when the preferred embodiments are implemented.

The preferred embodiments recite an array substrate that is an active matrix substrate provided with thin-film transistors (TFTs), which are switching devices. The array substrate can be used in a flat panel display (FPD), such as a liquid crystal display (LCD).

The preferred embodiments recite a capacitance that, in a broad sense, is the amount of electric charge stored between insulated conductors. In one example, capacitances are formed between a gate electrode and source and drain electrodes, via a gate insulating film and a semiconductor layer to be a channel layer.

First Preferred Embodiment

<Configuration of Liquid Crystal Display>

FIG. 1 is a plan view schematically illustrating the overall configuration of a liquid crystal display 100 according to a first preferred embodiment of the present invention.

As illustrated in FIG. 1, the liquid crystal display 100 includes a liquid-crystal display panel 90, which is a main component. The liquid-crystal display panel 90 has liquid crystals sandwiched between two substrates, i.e., an array substrate 10 and a counter substrate 20.

The array substrate 10 consists of a transparent substrate of an insulating material, such as glass or plastic. The array substrate 10 has a display region 50 in which images are displayed, and a frame region 55, which is a non-display region in contact with the display region 50. The frame region 55 in this preferred embodiment is provided to surround the display region 50.

The display region 50 has a plurality of gate wires 1 (i.e., scanning wires) extending in a lateral direction (i.e., X-direction), and a plurality of source wires 2 (i.e., signal wires) extending in a longitudinal direction (i.e., Y-direction). The gate wires 1 and the source wires 2 are arranged to intersect each other. The gate wires 1 adjacent to each other and the source wires 2 adjacent to each other constitute a region in which a single pixel 30 is formed. Thus, a plurality of pixels are arranged in matrix form (i.e., in array form). Each pixel includes a TFT (not shown). The TFT has a gate electrode (i.e., control electrode) formed of part of the gate wire 1, a source electrode (i.e., first main electrode) formed of part of the source wire 2, and a drain electrode (i.e., second main electrode) formed of part of a pixel electrode (not shown).

The periphery of the display region 50 is surrounded by a peripheral region 60. Disposed in the peripheral region 60 is a common wire 63. The common wire 63 serves as a bus line that supplies a common potential to a common electrode (not shown) disposed in the pixel 30. In a twisted-nematic (TM) liquid crystal display, the common electrode forms an auxiliary capacitance between the pixel electrodes. In a fringe-field-switching liquid crystal display, the common electrode forms a storage capacitance between the pixel electrodes.

FIG. 1 shows that a source driver circuit 3 that drives the source wires 2, and a gate driver circuit 4 that drives the gate wires 1, are disposed in the frame region 55. FIG. 1 also shows part of a source tapered wire 5 extending from the display region 50 to the output portion of the source driver circuit 3, and shows a gate tapered wire 6 extending from the display region 50 to the output portion of the gate driver circuit 4.

Disposed in the peripheral region 60 is an antistatic circuit, which will be described later on. The antistatic circuit is connected to each of the gate wire 1 and the source wire 2.

The counter substrate 20 is disposed over the display region 50 of the array substrate 10 to face the array substrate 10 through liquid crystals. The counter substrate 20 has a color filter, a black matrix, and other components.

The liquid crystal display 100 has a polarization plate and an optical retardation plate that are attached, as necessary, to both sides of a main surface of the liquid-crystal display panel 90. The liquid crystal display 100 also has a backlight outside the array substrate 10. The liquid crystal display 100 with these components are accommodated in a housing (not shown) along with an outside-connection circuit (not shown).

Figure 2:
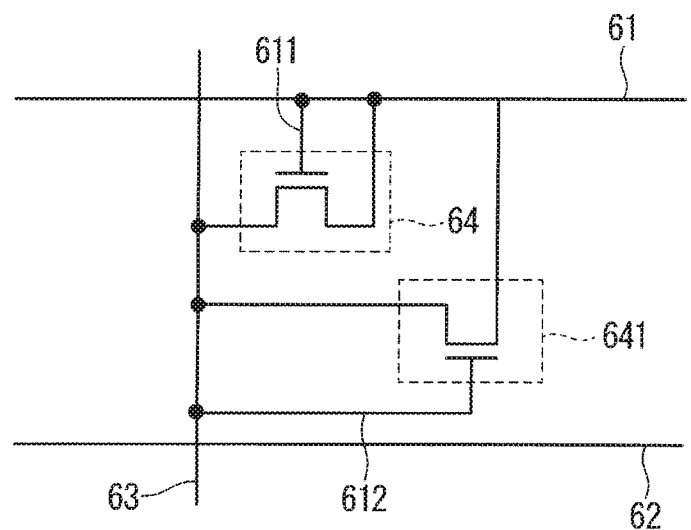
FIG. 2 is a diagram schematically illustrating the configuration of a typical antistatic circuit.

FIG. 2 is a diagram schematically illustrating the configuration of a typical antistatic circuit disposed in the peripheral region 60. FIG. 2 shows a signal wire 61 connected to the source wire 2 in the display region 50, a signal wire 62 adjacent to the signal wire 61, and the common wire 63 intersecting the signal wires 61 and 62. Disposed between the signal wire 61 and the common wire 63 are a MOS transistor 64 and a MOS transistor 641. The MOS transistor 64 has a source electrode and a gate electrode that are connected to the signal wire 61, and has a drain electrode connected to the common wire 63. The MOS transistor 641 has a source electrode connected to the signal wire 61, and a gate electrode and a drain electrode that are connected to the common wire 63. Although not shown for simple illustration, another MOS transistor 64 and another MOS transistor 641 are likewise connected to the adjacent signal wire 62.

Figure 3:
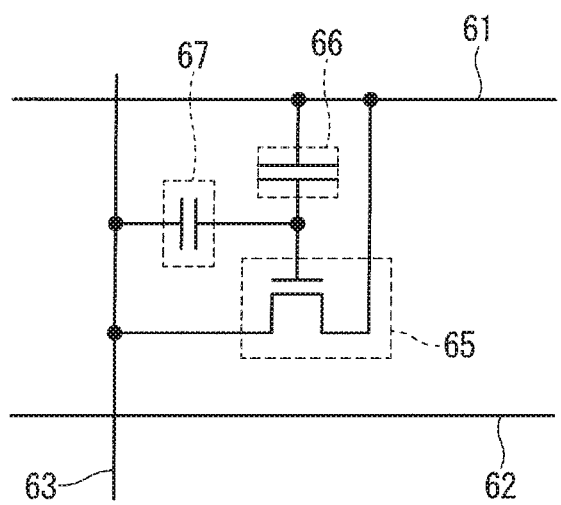
FIG. 3 is a diagram of an antistatic circuit included in the liquid crystal display according to the first preferred embodiment of the present invention.

FIG. 3 is a diagram of an equivalent circuit illustrating the antistatic circuit included in the liquid crystal display 100 according to the first preferred embodiment. The antistatic circuit in FIG. 3 includes a MOS transistor 65 (i.e., first transistor) having a floating gate electrode. The MOS transistor 65 is connected between the signal wire 61 and the common wire 63. The MOS transistor 65 has a source electrode connected to the signal wire 61, and a drain electrode connected to the common wire 63. A capacitance 66 (i.e., first capacitance) is formed between the floating gate of the MOS transistor 65 and the signal wire 61. In addition, a capacitance 67 (i.e., second capacitance) is formed between the floating gate of the MOS transistor 65 and the common wire 63. The capacitance 66 is larger than the capacitance 67.

Japanese Patent No. 4385691 discloses an antistatic circuit in which the capacitances 66 and 67 are almost equal to each other. In this antistatic circuit, low-voltage static electricity can fail to drive the MOS transistor 65 and can enter a display region.

In the antistatic circuit in FIG. 3, in contrast, the capacitance 66 between the signal wire 61, through which static electricity seems to enter, and the floating is larger. This enables a voltage across the floating gate during the entrance of the static electricity to approximate to a voltage across the signal wire 61, thereby enabling the MOS transistor 65 to be driven by low-voltage static electricity.

The antistatic circuit in FIG. 3 requires less MOS transistors than the typical antistatic circuit illustrated in FIG. 2. In addition, the antistatic circuit in FIG. 3 eliminates the need for a leading wire 611 of the gate electrode of the MOS transistor 64 of the typical antistatic circuit, and for a leading wire 612 of the gate electrode of the MOS transistor 641 of the typical antistatic circuit. Such a configuration advantageously achieves frame-region downsizing and high pixel-definition.

Figure 4:
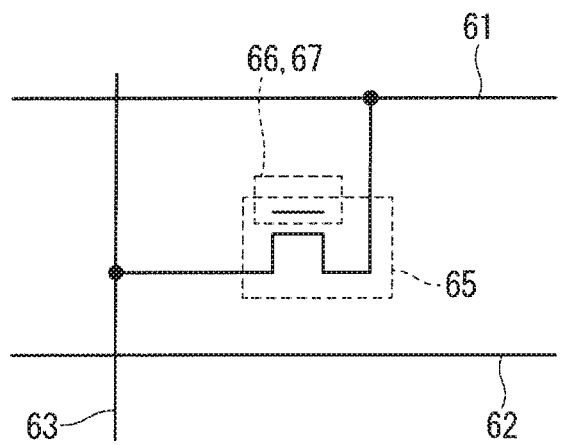
FIG. 4 is a diagram of a circuit illustrating the electrical connection of a MOS transistor included in the antistatic circuit of the liquid crystal display according to the first preferred embodiment of the present invention.

FIG. 4 is a diagram of a circuit briefly illustrating the electrical connection of the MOS transistor 65 of the antistatic circuit illustrated in FIG. 3. FIG. 4 shows that the MOS transistor 65 has a floating gate electrode, and that the capacitances 66 and 67 are formed.

Although the foregoing description has illustrated an antistatic circuit disposed between a signal wire and a common wire, the antistatic circuit according to the preferred embodiment can be located in any place. In one embodiment, a MOS transistor is placed in a location where static electricity possibly enters, e.g., between a scanning wire (i.e., gate wire) and a common wire, so as to have a large capacitance between the scanning wire and a floating gate, thus providing an antistatic circuit.

Here, the floating gate has a voltage $V_g$ that can be expressed by Expression 1, where the $C_l$ denotes the capacitance 66 between the signal wire 61 and the floating gate, where $C_c$ denotes the capacitance 67 between the common wire 63 and the floating gate, where $V_l$ denotes the voltage across the signal wire 61, where $V_c$ denotes a voltage across the common wire 63.

$$V_g = \frac{C_1 V_1 + C_c V_c}{C_1 + C_c} \quad (1)$$

The voltage $V_g$ across the floating gate can be approximated by Expression 2 when $C_l$ and $C_c$ are approximately equal to each other.

$$V_g \approx \frac{V_1 + V_c}{2} \quad (2)$$

Here, $V_l=V_l'+V_{ed}$ is satisfied when static electricity at the voltage $V_{ed}$ enters the signal wire 61, where $V_l'$ denotes a voltage originally applied across the signal wire 61. Accordingly, the voltage $V_g$ across the floating gate can be expressed by Expression (3).

$$V_g = \frac{V_1' + V_{ed} + V_c}{2} \quad (3)$$

The voltage $V_g$ across the floating gate is not sufficiently raised by the voltage $V_{ed}$, particularly when the voltage $V_{ed}$ of the static electricity is low. As a result, the MOS transistor 65, which is an antistatic circuit, possibly fails to operate. This causes the static electricity to enter the display region.

In the first preferred embodiment, the voltage $V_g$ across the floating gate is approximated as expressed by Expression (4), where the capacitance $C_l$ and the capacitance $C_c$ establish a magnitude relationship of $C_l \gg C_c$.

$$V_g \approx V_1 \quad (4)$$

At this time, the capacitance $C_l$ is desirably equal to or more than double the capacitance $C_c$.

Here, $V_l=V_l'+V_{ed}$ is satisfied when the static electricity at the voltage $V_{ed}$ enters the signal wire 61. Accordingly, the voltage $V_g$ at the floating gate is expressed by Expression (5).

$$V_g = V_1' + V_{ed} \quad (5)$$

As such, the voltage $V_g$ sufficiently rises when the voltage $V_{ed}$ of the static electricity is low. This enables the MOS transistor 65, which is an antistatic circuit, to operate, thereby preventing entrance of the static electricity to the display region.

That is, the MOS transistor 65 is turned on; accordingly, the static electricity at the voltage $V_{ed}$ that has entered the signal wire 61 flows through the common wire 63. When the voltage $V_{ed}$ is large, the MOS transistor (not shown) of the antistatic circuit connected to the adjacent signal wire 62 is turned on. Thus, the adjacent signal wire 62 consumes the power of the static electricity as well. In this way, the antistatic circuit in the first preferred embodiment consumes static electricity by passing the static electricity from one signal wire to another signal wire adjacent thereto.

At this time, if the voltage $V_c$ across the common wire 63 is large enough to drive the MOS transistor of the antistatic circuit, a signal fails to reach the display region, and thus the liquid crystal display loses its function. Accordingly, the voltage $V_c$ is set to be relatively small to a degree such that the voltage $V_c$ per se cannot drive the MOS transistor of the antistatic circuit, and the voltage $V_c$ is set so as to drive the MOS transistor of the antistatic circuit upon application of the voltage $V_{ed}$ of the static electricity. To be more specific, the MOS transistor of the antistatic circuit needs to have a threshold voltage higher than the voltage $V_l$ across the signal wire 61 and the voltage $V_c$ across the common wire 63.

Figure 5:
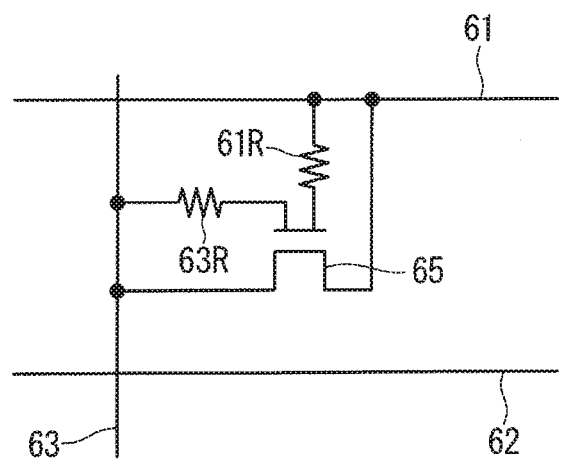
FIG. 5 is a diagram schematically illustrating the configuration of the MOS transistor included in the antistatic circuit of the liquid crystal display according to the first preferred embodiment of the present invention, the MOS transistor having a high-resistance resistor between its gate electrode and a signal wire, and a high-resistance resistor between its gate electrode and a common wire.

Moreover, the gate electrode of the MOS transistor 65 may be connected to the signal wire 61 and the common wire 63 at a high resistance that leads to voltage change under the influence of the entrance of the static electricity, in order to help the capacitances drive the MOS transistor of the antistatic circuit. FIG. 5 is a diagram schematically illustrating high-resistance resistors 61R and 63R. The high-resistance resistor 61R is between the gate electrode of the MOS transistor 65 and the signal wire 61. The high-resistance resistor 63R is between the gate electrode of the MOS transistor 65 and the common wire 63.

Figure 6:
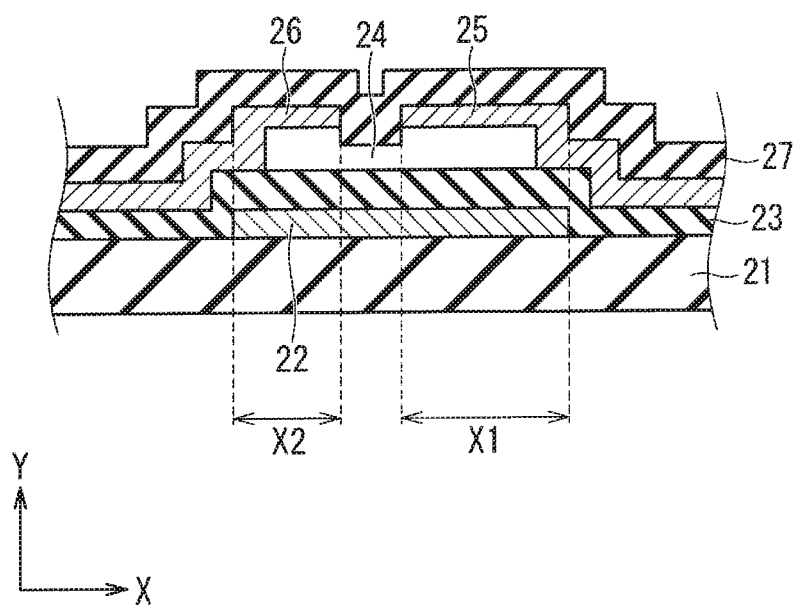
FIG. 6 is a cross-sectional view illustrating the structure of the MOS transistor included in the antistatic circuit of the liquid crystal display according to the first preferred embodiment of the present invention.

FIG. 6 is a cross-sectional view illustrating the structure of a MOS transistor of the antistatic circuit according to the first preferred embodiment. As illustrated in FIG. 6, the MOS transistor includes the following: a gate electrode 22 selectively disposed on an insulating substrate 21 made of a transparent material, such as glass; an insulating film 23 disposed over the gate electrode 22; a semiconductor layer 24 disposed on the insulating film 23 and above the gate electrode 22; and a source electrode 25 and a drain electrode 26 each continuously disposed on the semiconductor layer 24 and the insulating film 23. The MOS transistor also includes an insulating film 27 disposed over the semiconductor layer 24, the source electrode 25, and the drain electrode 26.

The gate electrode 22 is electrically floating, or is connected to the signal wire (not shown) and the common wire via the resistor having, as illustrated in FIG. 5, a high resistance that leads to voltage change under the influence of the entrance of the static electricity.

The insulating film 23 serves as a gate insulating film between the gate electrode 22 and the semiconductor layer 24. The semiconductor layer 24 overlaps the gate electrode 22 in plan view. The semiconductor layer 24 is desirably disposed inside the outer edge of the gate electrode 22 in plan view.

The source electrode 25 and the drain electrode 26 are disposed on the semiconductor layer 24 so as to be spaced from each other. The semiconductor layer 24 between the source electrode 25 and the drain electrode 26 serves as a channel layer while the MOS transistor is operating. The source electrode 25 of the MOS transistor is connected to the signal wire, and the drain electrode 26 of the same is connected to the common wire.

Here, FIG. 6 shows a length X1 indicating how long the source electrode 25 and the gate electrode 22 overlap each other in the horizontal direction (i.e., X-direction), and shows a length X2 indicating how long the drain electrode 26 and the gate electrode 22 overlap each other in the X-direction. The length X1 is longer than the length X2. Thus, the MOS transistor has a difference in area between the overlap of the source electrode 25 in a two-dimensional direction and the overlap of the drain electrode 26 in the two-dimensional direction. This establishes a difference between the capacitance formed between the source electrode 25 and the gate electrode 22, and the capacitance formed between the drain electrode 26 and the gate electrode 22. As such, the capacitance between the source electrode 25 and the gate electrode 22 is larger than the capacitance between the drain electrode 26 and the gate electrode 22. Accordingly, the MOS transistor 65 in FIG. 3 is obtained.

In this case, the length X1 is long enough to achieve a capacitance that can drive the MOS transistor under low-voltage static electricity. In addition, the difference between the lengths X1 and X2 is set so that a significant difference is established (i.e., the capacitance $C_l$ and the capacitance C establish a magnitude relationship of $C_l \gg C_c$), and is also set to reflect processing precision in processes, such as photolithography and etching.

Figure 7:
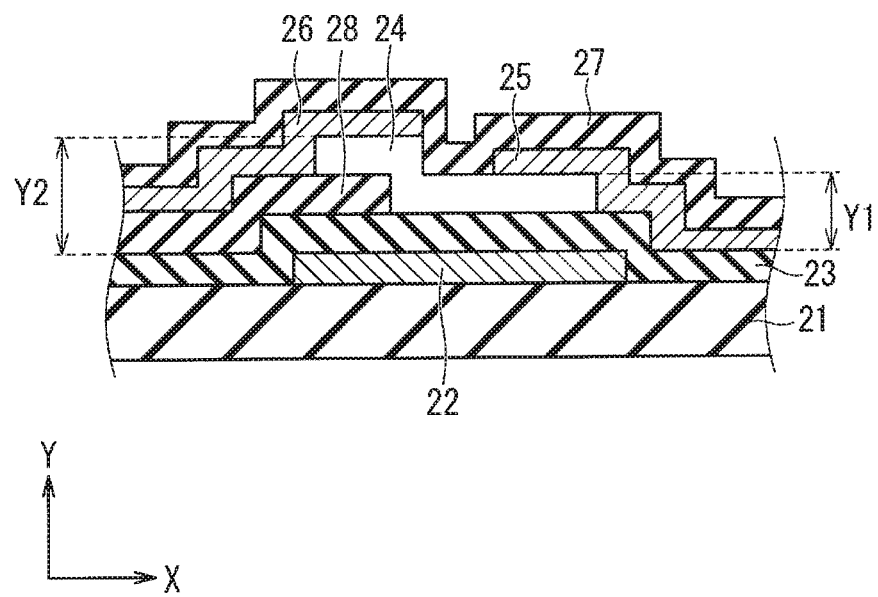
FIG. 7 is another cross-sectional view illustrating the structure of the MOS transistor included in the antistatic circuit of the liquid crystal display according to the first preferred embodiment of the present invention.

FIG. 7 is another cross-sectional view illustrating the structure of the MOS transistor of the antistatic circuit according to the first preferred embodiment. The MOS transistor in FIG. 7 includes an insulating film 28 disposed on the insulating film 23 above which the drain electrode 26 is disposed. The semiconductor layer 24 covers part of the upper part of the insulating film 28 above the gate electrode 22, and covers the insulating film 23 above the gate electrode 22. The semiconductor layer 24 has a step under the drain electrode 26, but has no steps under the source electrode 25. This renders a distance Y1 shorter than a distance Y2, thus establishing a difference between the capacitance formed between the source electrode 25 and the gate electrode 22, and the capacitance formed between the drain electrode 26 and the gate electrode 22. Herein, the distance Y1 indicates how long the source electrode 25 is spaced from the gate electrode 22 in the vertical direction (i.e., Y-direction) of FIG. 7, and the length Y2 indicates how long the drain electrode 26 is spaced from the gate electrode 22.

As such, the capacitance between the source electrode 25 and the gate electrode 22 is larger than the capacitance between the drain electrode 26 and the gate electrode 22. Accordingly, the MOS transistor 65 in FIG. 3 is obtained.

In this case, the distance Y1 is long enough to achieve a capacitance that can drive the MOS transistor under low-voltage static electricity. In addition, the difference between the distances Y1 and Y2 is set so that a significant difference is established (i.e., the capacitance $C_l$ and the capacitance $C_c$ establish a magnitude relationship of $C_l \gg C_c$), and is set to reflect thickness precision in a process of forming a film that is to be a wire, such as sputtering and etching.

Figure 8:
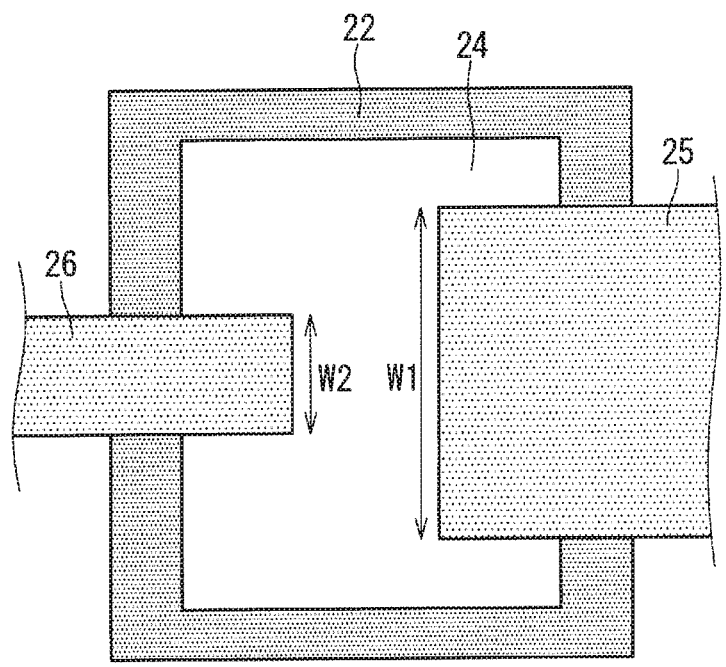
FIG. 8 is a plan view illustrating the structure of the MOS transistor included in the antistatic circuit of the liquid crystal display according to the first preferred embodiment of the present invention.

FIG. 8 is a plan view illustrating the structure of the MOS transistor of the antistatic circuit according to the first preferred embodiment. FIG. 8 shows that the gate electrode 22, the semiconductor layer 24, the source electrode 25, and the drain electrode 26 overlap each other in the two-dimensional direction when viewed from above. As illustrated in FIG. 8, a side of the source electrode 25 that overlaps the semiconductor layer 24 faces, in plan view, a side of the drain electrode 26 that overlaps the semiconductor layer 24. The length of the side of the source electrode 25, i.e., the electrode width, is denoted by a width W1. The length of the side of the drain electrode 26, i.e., the electrode width, is denoted by a width W2. The width W1 is longer than the width W2. Thus, the MOS transistor has a difference in area between the overlap of the source electrode 25 in the two-dimensional direction and the overlap of the drain electrode 26 in the two-dimensional direction. This establishes a difference between the capacitance formed between the source electrode 25 and the gate electrode 22, and the capacitance formed between the drain electrode 26 and the gate electrode 22. As such, the capacitance between the source electrode 25 and the gate electrode 22 is larger than the capacitance between the drain electrode 26 and the gate electrode 22. Accordingly, the MOS transistor 65 in FIG. 3 is obtained.

In this case, the width W1 is long enough to achieve a capacitance that can drive the MOS transistor under low-voltage static electricity. In addition, the difference between the width W1 and W2 is set so that a significant difference is established (i.e., the capacitance $C_l$ and the capacitance $C_c$ establish a magnitude relationship of $C_l \gg C_c$), and is also set to reflect processing precision in processes, such as photolithography and etching.

It is noted that the examples of the MOS transistor in FIGS. 6 to 8, alone or in combination, achieve similar effects.

The semiconductor layer 24 to be the channel layer of the MOS transistor (c.f., FIGS. 6 to 8), is formed of an oxide semiconductor. This prevents fluctuations in the threshold voltage of the MOS transistor if static electricity repeatedly occurs. Consequently, the static electricity is stably prevented.

An example of the oxide semiconductor is an InGaZnO-based oxide semiconductor that is made of indium oxide ($In_2O_3$) to which gallium oxide ($Ga_2O_3$) and zinc oxide (ZnO) is added. Such an oxide semiconductor can be produced using a known method such as that disclosed in PCT International Publication No. WO2016/175034 A1.

Second Preferred Embodiment

Figure 9:
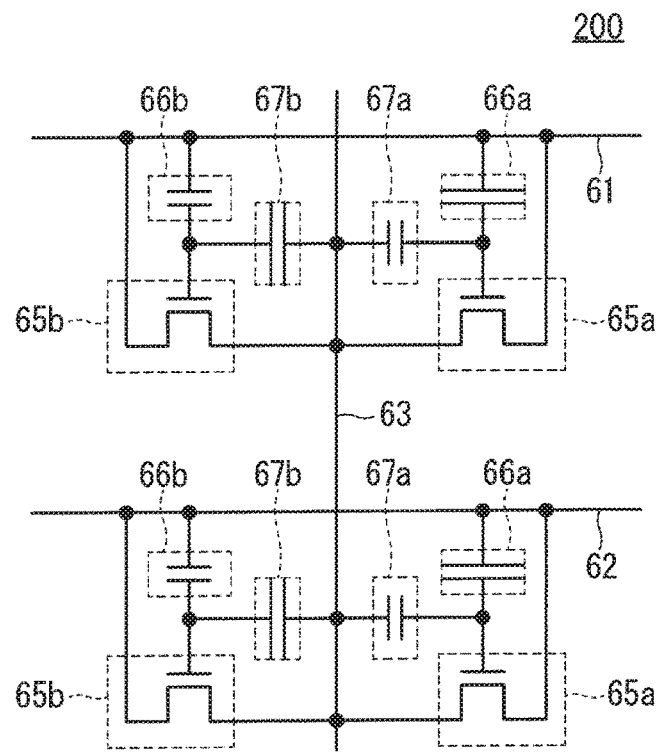
FIG. 9 is a diagram of an antistatic circuit included in a liquid crystal display according to a second preferred embodiment of the present invention.

FIG. 9 is a diagram of an equivalent circuit illustrating an antistatic circuit included in a liquid crystal display 200 according to a second preferred embodiment of the present invention. The overall configuration of the liquid crystal display 200 is similar to the overall configuration of the display apparatus 100 illustrated in FIG. 1.

The antistatic circuit in FIG. 9 includes two MOS transistors 65a and 65b each having a floating gate electrode. The MOS transistors 65a and 65b are connected between the signal wire 61 and the common wire 63. That is, the MOS transistor 65a (i.e., first transistor) has a source electrode connected to the signal wire 61, and a drain electrode connected to the common wire 63. In addition, the MOS transistor 65b has a source electrode connected to the signal wire 61, and a drain electrode connected to the common wire 63. A capacitance 66a (i.e., first capacitance) is formed between the floating gate of the MOS transistor 65a and the signal wire 61. In addition, a capacitance 67a (i.e., second capacitance) is formed between the floating gate of the MOS transistor 65a and the common wire 63. The capacitance 66a is larger than the capacitance 67a. Further, a capacitance 66b (i.e., first capacitance) is formed between the floating gate of the MOS transistor 65b and the signal wire 61. In addition, a capacitance 67b (i.e., second capacitance) is formed between the floating gate and the MOS transistor 65b and the common wire 63. The capacitance 67b is larger than the capacitance 66b. Still further, another MOS transistor 65a and another MOS transistor 65b are likewise connected to the adjacent signal wire 62.

As described above, the antistatic circuit of the liquid crystal display 200 according to the second preferred embodiment includes two MOS transistors in floating state connected between a pair of signal and common wires. Each MOS transistor has a capacitance between its floating gate and the signal wire, and a capacitance between its floating gate and the common wire. The magnitude relationship between the capacitances in one of the MOS transistors is reverse to the magnitude relationship between the capacitances in the other MOS transistor.

Such a configuration achieves the following effect. That is, upon entrance of low-voltage static electricity into the signal wire 61, the MOS transistor 65a is turned on to dissipate the static electricity to the common wire 63. Furthermore, the static electricity flowing through the common wire 63 turns on the MOS transistor 65b connected to the adjacent signal wire 62. The MOS transistor 65b in ON state then dissipates the static electricity to the adjacent signal wire 62. Consequently, the power consumption of the static electricity increases. This further enhances static-electricity prevention. In this way, the antistatic circuit, which includes the MOS transistor 65b that operates in response to low-voltage static electricity flowing through the common wire 63, further enhances static-electricity prevention. In addition, the antistatic circuit enables low-voltage static electricity that has entered from the common wire 63 to be dissipated in a similar manner.

The antistatic circuit according to the second preferred embodiment, which includes the MOS transistors 65a and 65b connected between the pair of signal and common wires, needs more MOS transistors, but needs no leading wires of their gate electrodes. When compared to the typical antistatic circuit in FIG. 2, the antistatic circuit according to the second preferred embodiment advantageously achieves frame-region downsizing and high pixel-definition.

Figure 10:
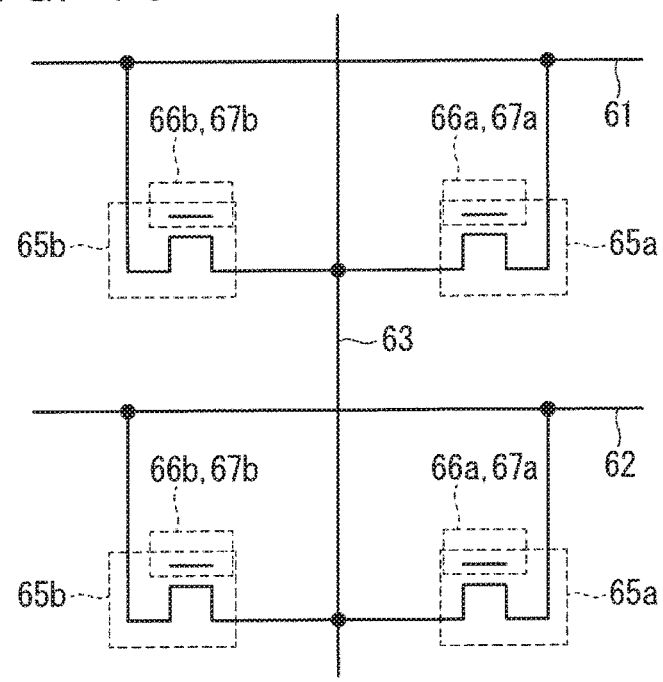
FIG. 10 is a diagram of a circuit illustrating the electrical connection of MOS transistors included in the antistatic circuit of the liquid crystal display according to the second preferred embodiment of the present invention.

FIG. 10 is a diagram of a circuit briefly illustrating the electrical connection of the MOS transistors 65a and 65b of the antistatic circuit in FIG. 9. FIG. 10 shows that the MOS transistors 65a and 65b each have a floating gate electrode. FIG. 10 also shows that the capacitances 66a and 67a are formed in the MOS transistor 65a, and that the capacitances 66b and 67b are formed in the MOS transistor 65b.

The two MOS transistors are connected between the pair of signal and common wires. Each MOS transistor has a capacitance between its floating gate and the signal wire, and a capacitance between its floating gate and the common wire. Like the MOS transistor in FIGS. 6 to 8, the magnitude relationship between the capacitances in each MOS transistor can be freely determined by changing the area of an overlap between the gate and source electrodes, and changing the area of an overlap between the gate and drain electrodes, or by changing the distance between the gate and source electrodes in the vertical direction, and changing the distance between the gate and drain electrodes in the vertical direction.

The semiconductor layers to be channel layers of the MOS transistors 65a and 65b are formed of an oxide semiconductor. This prevents fluctuations in the threshold voltages of the MOS transistors 65a and 65b if static electricity repeatedly occurs. Consequently, the static electricity is stably prevented.

<Modification>

The MOS transistor in FIGS. 6 and 8 is a channel-etched TFT. Examples of a TFT that forms an antistatic circuit include an etching-stopper TFT, a top-gate TFT, and any TFT that has a capacitance formed between the drain electrode and the floating gate electrode, and a capacitance formed between the source electrode and the floating gate electrode.

The liquid crystal display 100 in FIG. 1 includes the source driver circuit 3 and the gate driver circuit 4 in the frame region. The antistatic circuits according to the first and second embodiments can be used in a liquid crystal display that includes a driver circuit bounded through tape automated bonding (TAB), and in a liquid crystal display that includes an array substrate having a driver circuit that has a TFT of, for instance, polysilicon and is formed at the same time as the formation of a TFT of a pixel.

That is, the antistatic circuits according to the first and second preferred embodiments are formed between at least one of the signal and scanning wires and the common wire, in an array process step of forming the TFT of the pixel. As such, these antistatic circuits can be formed in any region provided with a signal wire, a scanning wire, and a common wire, regardless of where a driver circuit is formed.

The first and second preferred embodiments have described liquid crystal displays for convenience. The antistatic circuits according to the first and second preferred embodiments can be included in any display other than a liquid crystal display.

In some cases, the first and second preferred embodiments describe the material quality of each component, or describe the material, dimension, and shape of each component, or describe the relative relationship in arrangement between the components, or describe conditions for implementation. These descriptions are illustrative in all aspects, and are thus not limited to what have described in the Specification. It is thus understood that numerous modifications and variations can be devised without departing from the scope of the invention. For instance, at least one component can be modified, added, or omitted. Further, at least one component can be extracted from at least one preferred embodiment to be thus combined with a component in another preferred embodiment.

Unless otherwise contradicted, the components described in the aforementioned preferred embodiments in such a manner that "one component" is provided, may be formed of "one or more" components. Further, the individual components are conceptual units. Thus, one component can be formed of multiple structures, one component can correspond to part of a certain structure having one component, and multiple components can be included in one structure. Each component includes a structure having a different configuration or shape as long as the same function is achieved.

The foregoing descriptions in the Specification are referred for all purposes relating to the present technique. It is thus not an admission that any of the descriptions provided herein are conventional techniques.

In some cases, the aforementioned preferred embodiments recite a material that is not particularly specified. Unless otherwise contradicted, an example of this material is one that contains other additives, e.g., an alloy.

What is claimed is:

1. A display provided with a display region and a non-display region in contact with the display region, the display region being provided with scanning wires and signal wires arranged to intersect each other, and with pixels arranged in matrix form, the pixels each being disposed in a region defined by the scanning wires adjacent to each other and the signal wires adjacent to each other, the display comprising:

an antistatic circuit disposed between a common wire and at least one of each of the signal wires and each of the scanning wires in the display region, the common wire being disposed in the non-display region and configured to receive a common potential and supply the common potential to a counter electrode of the display, wherein the antistatic circuit at least includes a first transistor, the first transistor including a floating control electrode, a first main electrode connected to one of the signal wires or one of the scanning wires, and a second main electrode connected to the common wire, the first transistor is provided in such a manner that a first capacitance formed between the control electrode and the one signal wire or the one scanning wire is larger than a second capacitance formed between the control electrode and the common wire, and a magnitude relationship between the first and second capacitances in the first transistor is defined by setting a distance between the control electrode and the first main electrode in a vertical direction, and setting a distance between the control electrode and the second main electrode in the vertical direction, in such a manner that the distance between the control electrode and the first main electrode of the first transistor in the vertical direction is shorter than the distance between the control electrode and the second main electrode of the first transistor in the vertical direction.

2. The display according to claim 1, wherein
the antistatic circuit further includes a second transistor, the second transistor including a floating control electrode, a first main electrode connected to each of the signal wires or each of the scanning wires, and a second main electrode connected to the common wire, and
the second transistor is provided in such a manner that a second capacitance between the control electrode and the common wire is larger than a first capacitance between the control electrode and each of the signal wires or each of the scanning wires.

3. The display according to claim 1, wherein
the magnitude relationship between the first and second capacitances in the first transistor is further defined by setting areas of the first and second main electrodes in such a manner that an area of an overlap between the control electrode and the first main electrode in a two-dimensional direction is larger than an area of an overlap between the control electrode and the second main electrode in the two-dimensional direction.

4. The display according to claim 2, wherein
the magnitude relationship between the first and second capacitances in the first transistor is further defined by setting areas of the first and second main electrodes in such a manner that an area of an overlap between the control electrode and the first main electrode of the first transistor in a two-dimensional direction is larger than an area of an overlap between the control electrode and the second main electrode of the first transistor in the two-dimensional direction, and
a magnitude relationship between the first and second capacitances in the second transistor is defined by setting areas of the first and second main electrodes in such a manner that an area of an overlap between the control electrode and the second main electrode of the second transistor in a two-dimensional direction is larger than an area of an overlap between the control electrode and the first main electrode of the second transistor in the two-dimensional direction.

5. The display according to claim 2, wherein
a magnitude relationship between the first and second capacitances in the second transistor is further defined by setting a distance between the control electrode and the first main electrode in a vertical direction, and setting a distance between the control electrode and the second main electrode in the vertical direction, in such a manner that the distance between the control electrode and the second main electrode of the second transistor in the vertical direction is shorter than the distance between the control electrode and the first main electrode of the second transistor in the vertical direction.

6. The display according to claim 1, wherein
the first transistor includes a channel layer disposed with a gate insulating film interposed between the control electrode and the channel layer, and
the channel layer is formed of an oxide semiconductor.

7. The display according to claim 2, wherein
the first transistor includes a channel layer disposed with a gate insulating film interposed between the control electrode of the first transistor and the channel layer of the first transistor, the channel layer of the first transistor is formed of an oxide semiconductor, the second transistor includes a channel layer disposed with a gate insulating film interposed between the control electrode of the second transistor and the channel layer of the second transistor, and the channel layer of the second transistor is formed of an oxide semiconductor.

\* \* \* \* \*